United States Patent [19]

Yamamoto et al.

[11] Patent Number: 5,219,920

[45] Date of Patent: Jun. 15, 1993

[54] POLYARYLENE SULFIDE RESIN COMPOSITION

[75] Inventors: Naoki Yamamoto; Hiroshi Mori, both of Hiroshima; Akira Nakata; Takuya Ueno, both of Otake, all of Japan

[73] Assignee: Mitsubishi Rayon Co., Ltd., Tokyo, Japan

[21] Appl. No.: 892,489

[22] Filed: Jun. 3, 1992

Related U.S. Application Data

[63] Continuation of Ser. No. 431,081, Nov. 3, 1989, abandoned.

[30] Foreign Application Priority Data

Nov. 4, 1988 [JP] Japan ................. 63-278970

[51] Int. Cl.$^5$ ................................ C08L 81/00
[52] U.S. Cl. ................. 524/609; 525/474; 525/476; 525/477; 525/478; 525/479; 524/266; 524/268
[58] Field of Search ............. 525/474, 476, 477, 478, 525/479; 524/266, 268

[56] References Cited

U.S. PATENT DOCUMENTS

| | | | |
|---|---|---|---|
| 4,370,292 | 1/1983 | Yanase et al. | 525/534 |
| 4,450,266 | 5/1984 | Idel et al. | 525/474 |
| 4,581,411 | 4/1986 | Liang et al. | 525/189 |
| 4,690,986 | 9/1987 | Sasaki et al. | 525/479 |
| 4,743,639 | 5/1988 | Liang | 524/188 |
| 4,787,991 | 11/1988 | Morozumi | 252/12.4 |
| 4,888,390 | 12/1989 | Liang et al. | 525/189 |
| 5,011,887 | 4/1991 | Sasaki et al. | 525/63 |

FOREIGN PATENT DOCUMENTS

| | | |
|---|---|---|
| 0142825 | 5/1985 | European Pat. Off. . |
| 0286257 | 10/1988 | European Pat. Off. . |
| 3635276 | 4/1987 | Fed. Rep. of Germany . |
| 56-118456 | 9/1981 | Japan . |
| 58-154757 | 9/1983 | Japan . |
| 59-207921 | 11/1984 | Japan . |
| 60-120753 | 6/1985 | Japan . |
| 61-21156 | 1/1986 | Japan . |
| 62-151460 | 7/1987 | Japan . |

OTHER PUBLICATIONS

Patent Abstracts of Japan, vol. 12, No. 50 (C–476) (2897) Feb. 16, 1988; JP–A 62-197451 Sep. 1987 (Dainippon Ink & Chem. Inc.).

Primary Examiner—Melvyn I. Marquis
Assistant Examiner—Helen F. Lee
Attorney, Agent, or Firm—Cushman, Darby & Cushman

[57] ABSTRACT

A polyarylene sulfide resin composition comprising a compound obtained by mixing 60–99 parts by weight of a polyarylene sulfide resin (A), 40–1 parts by weight of a polyorganosiloxane rubber (B), 0.01–10 parts by weight of an organosilane compound having at least one epoxy group and at least one alkoxy group bonded directly to a silicon atom (C) and 0–300% by weight of a reinforcing filler (D) based on the total weight of the components (A), (B) and (C) where the total amount of the components (A) and (B) is 100 parts by weight. The polyarylene sulfide resin composition is excellent in impact resistance, heat resistance, mechanical strength, moldability and the like.

6 Claims, No Drawings

POLYARYLENE SULFIDE RESIN COMPOSITION

This is a continuation of application Ser. No. 07/431,081, filed on Nov. 3, 1989, which was abandoned upon the filing hereof.

The present invention relates to a polyarylene sulfide resin composition having improved impact resistance. More particularly, the present invention relates to a polyarylene sulfide resin composition excellent in impact resistance, heat resistance and the like comprising a polyarylene sulfide resin, a polyorganosiloxane rubber, a particular organosilane compound and, if necessary, a reinforcing filler. A polyarylene sulfide resin composition according to the present invention is used for electrical and electronic parts, mechanical parts and the like, particularly for surface mounting connectors requiring heat resistance and toughness.

Polyarylene sulfide resins have recently attracted one's attention as engineering plastics having excellent heat resistance and chemical resistance. The conventional polyarylene sulfide resins, however, have significant drawbacks in that they are fragile and inferior in ductility.

Recently, there has been developed a linear polyarylene sulfide resin which is unlike the conventional heat-crosslinkable polyarylene sulfide resins. Although the linear polyarylene sulfide resin is a little improved in toughness, it still has room for improvement for the present.

Although a filler such as glass fiber or the like has been heretofore mixed with a polyarylene sulfide resin in order to improve impact resistance thereof, satisfactory results have not yet been obtained.

Also, methods of adding various rubber components are disclosed as measures to improve toughness in Japanese Patent Application Kokai No. 56-118456, 58-154757, 59-207921, 60-120753, 61-21156 and 62-151460. However, a molding temperature of a polyarylene sulfide resin is a high temperature of 300° C. or more. In such a high temperature range, ordinary diene-type rubbers are deteriorated on account of heat and causes trouble in properties of molded articles and appearance of the surface thereof. Further, the polyarylene sulfide resin compositions containing these rubber components do not have sufficient resistance.

The present inventors have eagerly investigated a method for improving impact resistance while maintaining excellent heat resistance and mechanical strength which a polyarylene sulfide resin inherently has as they are. As a result, they have found that a resin composition having a remarkably improved impact resistance and excellent in heat resistance, mechanical strength, moldability and the like can be obtained by mixing a polyarylene sulfide resin with a particular polyorganosiloxane rubber, an organosilane compound having a particular functional group and a reinforcing filler if necessary.

The present invention relates to a polyarylene sulfide resin composition comprising a composition obtained by mixing 60–99 parts by weight of a polyarylene sulfide resin (A), 40–1 parts by weight of a polyorganosiloxane rubber (B), 0.01–10 parts by weight of an organosilane compound having at least one epoxy group and at least one alkoxy group bonded directly to a silicon atom (C) and 0–300% by weight of a reinforcing filler (D) based on the total weight of the components (A), (B) and (C) where the total amount of the components (A) and (B) is 100 parts by weight.

An object of the present invention is to provide a polyarylene sulfide resin composition excellent in impact resistance, heat resistance, mechanical strength, moldability and the like.

Other objects and advantages will become apparent from the following description.

Polyarylenesulfide resins (A) include polymers each having both a unit represented by the following general formula (I-a) and a unit represented by the following general formula (I-b), and mixture of two or more thereof:

     (I-a)

     (I-b)

where each of $Ar^1$ and $Ar^2$ is independently

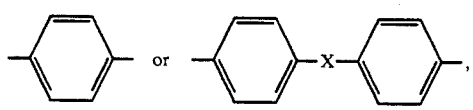

where X is $-SO_2-$, $-CO-$, $-O-$ or an alkylene group having 5 or less carbon atom. In the general formulas (I-a) and (I-b), an aromatic ring can have 1-3 halogen atoms or a methyl group as a substituent(s). The alkylene groups each having 5 or less carbon atoms include a methylene group, polymethylene groups having 2-5 carbon atoms, the methylene and polymethylene groups each of which has one or two methyl groups on its chain and has 5 or less carbon atoms in total.

Of polyarylene sulfide resins (A) mentioned above, a polyphenylene sulfide resin is preferably used.

Polyorganosiloxane rubbers (B) are not particularly restricted but preferably comprise a copolymer of an organosiloxane with a crosslinking agent.

Organoslioxanes include hexamethylcyclotrisiloxane, octamethylcyclotetrasiloxane, decamethylcyclopentasiloxane, dodecamethylcyclohexasiloxane, trimethyltriphenylcyclotrisiloxane, tetramethyltetraphenylcyclotetrasiloxane, octaphenylcyclotetrasiloxane and the like. These organisiloxanes are used alone or in admixture of two or more.

An amount of an organosiloxane is 50% by weight or more, preferably 70% by weight or more based on the polyorganosiloxane rubber.

As a polyorganosiloxane rubber there is preferably used a rubber comprising, as a main component, polydimethylsiloxane obtained from an organosiloxane such as hexamethylcyclotrisiloxane, octamethylcyclotetrasiloxane, decamethylcyclopentasiloxane, dodecamethylcyclohexasiloxane or the like.

In carrying out the present invention, the above polyorganosiloxane rubber (B) preferably has a degree of swelling in a range of 3–50 measured using toluene as a solvent and is preferably in the form of powder having an average particle size in a range of 0.1 μm–0.5 μm.

As crosslinking agents, trifunctional and tetrafunctional siloxane, preferably trialkoxysilanes or tetraalkoxysilanes are enumerated. Trialkoxysilanes and tetraalkoxysilanes include trimethoxymethylsilane, triethoxyphenylsilane, tetramethoxysilane, tetraethoxysilane, tetrabutoxysilane and the like.

An amount of a crosslinking agent is in a range of 0.2–30% by weight based on a polyorganosiloxane rubber. However, the used amount should be preferably controlled so that a degree of swelling of the polyorganosiloxane rubber may be in a range of 3–50. When a degree of swelling is less than 3, rubber elasticity cannot be exhibited because of too much crosslinking agent. Also, when a degree of swelling is more than 50, the rubber shows insufficient properties as rubber and hence impact resistance tends to be decreased.

A degree of swelling is defined as a proportion by weight of toluene absorbed by a polyorganosiloxane rubber when the polyorganosiloxane rubber is swollen by toluene at 25° C., and is measured as follows:

A polyorganosiloxane rubber latex obtained by polymerization is added to about 3–5 parts by volume, based on the latex, of isopropyl alcohol with stirring. An emulsion is broken and subjected to aggregation. Thereby is obtained a polyorganosiloxane rubber. The obtained polymer is washed with water and thereafter dried at 80° C. for 10 hours at a reduced pressure. Thereafter, about 1 g of the polymer is weighed exactly and then immersed in about 60 g of toluene. The polymer is allowed to stand at 25° C. for 100 hours to be swollen. The residual toluene is removed by decantation.

The swollen polymer is weighed exactly and then dried at 80° C. for 16 hours at a reduced pressure to evaporate absorbed toluene. The dried polymer is weighed exactly. A degree of swelling is calculated according to the following equation:

[Degree of swelling] =

$$\frac{\text{[Weight of swollen Polymer]} - \text{[Weight of dried polymer]}}{\text{[Weight of dried polymer]}}$$

A polyorganosiloxane rubber can be prepared, for example, according to methods disclosed in U.S. Pat. No. 2,891,920 and No. 3,294,725.

A polyorganosiloxane rubber is preferably prepared by shearing and mixing with water a mixed solution of an organosiloxane and a crosslinking agent in the presence of an emulsifying agent such as an alkylbenzenesulfonic acid, an alkylsulfonic acid or the like and thereafter subjecting the resulting mixture to polymerization. An alkylbenzenesulfonic acid is preferably used as an emulsifying agent since it serves as a polymerization initiator as well as an emulsifying agent. At this time, a metal alkylbenzenesulfonate or a metal alkylsulfonate is preferably used in combination with the above-mentioned emulsifying agent since it has an effect on maintaining a rubber latex stable.

An average particle size of a polyorganosiloxane rubber is not particularly restricted but preferably in a range of 0.1 μm–0.5 μm. When the average particle size is less than 0.1 μm or more than 0.5 μm, impact resistance is not sufficiently exhibited. The average particle size can be freely controlled by changing the conditions of shearing and mixing before the polymerization.

The average particle size is measured using a sample liquid obtained by diluting the obtained polyorganosiloxane rubber latex with water, according to quasi-elastic light scattering method (measuring apparatus: MALVERN SYSTEM 4600; measurement temperature: 25° C.; scattering angle: 90° C.).

An organosilane compound having at least one epoxy group and at least one alkoxy group bonded directly to a silicon atom in its molecule (C) (hereinafter referred to as organosilane compound (C) in some places) is a compound or a mixture of two or more compounds which compound is represented by the following formula (II):

where n is an integer of 1—3, R is a direct bond, an alkylene group having 2–6 carbon atoms or a dialkylene ether group having 4–7 carbon atoms represented by the formula:

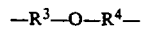

where each of $R^3$ and $R^4$ is independently an alkylene group, a total number of carbon atoms in both $R^3$ and $R^4$ being 4–7, $R^2$ is a methyl group or ethyl group, Y is

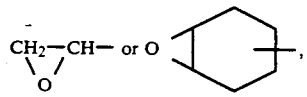

Z is a methoxy group or ethoxy group.

Organosilane compound (C) can also be 9,10-epoxydecyltrimethoxysilane. Preferred organosilane compounds (C) include γ-glycidoxypropyltrimethoxysilane, γ-glycidoxypropylmethyldiethoxysilane, β-(3,4-epoxycyclohexyl)ethyltrimethoxysilane and the like.

A polyarylene sulfide resin composition according to the present invention comprises a composition obtained by mixing 60–99 parts by weight of the above-mentioned polyarylene sulfide resin (A), 40–1 parts by weight of the above-mentioned polyorganosiloxane rubber (B), 0.01–10 parts by weight of the above-mentioned organosilane compound (C) and 0–300% by weight of a reinforcing filler (D) based on the total weight of the components (A), (B) and (C) where the total amount of the components (A) and (B) is 100 parts by weight.

When the amount of the (B) component is less than 1 parts by weight, impact resistance is insufficient. When it is more than 40 parts by weight, heat resistance lowers. Further, when the amount of the (C) component is less than 0.01 parts by weight, impact resistance is insufficient, and when it is more than 10 parts by weight, fluidity and the like are adversely affected.

Reinforcing fillers (D) used in the present invention include fibrous reinforcing agents such as glass fiber, carbon fiber, potassium titanate, asbestos, silicon carbide, ceramics fibers, metal fibers, silicon nitride, aramide fibers and the like; barium sulfate, calcium sulfate, kaolin, clay, pyrophyllite, bentonite, sericite, mica, talc, atarpargite, wollastonite, PMF, ferrite, calcium silicate, calcium carbonate, magnesium carbonate, dolomite, antimony trioxide, zinc oxide, titanium oxide, magnesium oxide, iron oxide, molybdenum disulfide, graphite, gypsum, glass beads, glass balloon, quartz powder and the like.

A reinforcing filler is added in an amount of 0–300% by weight based on the total weight of the components (A), (B) and (C).

A reinforcing filler can further improve impact resistance.

Incidentally, a known silane coupling agent can be used when a reinforcing filler is mixed.

Also, the resin composition of the present invention can comprise a small amount of a mold releasing agent, a coloring agent, a heat stabilizer, an ultraviolet light stabilizer, a blowing agent, a rust preventive, a flame retarder, a flame retarder assistant or the like within the scope of the objects of the present invention.

The present invention is explained more specifically below referring the following Referential Examples, Examples and Comparative Examples. However, the present invention should not be construed to be restricted to the Examples.

In the following Examples and Comparative Examples, physical properties were measured according to the following method:

Izod impact strength: ASTM D 256 (with ⅛" notch)

Heat distortion temperature: ASTM D 648 (under a load of 18.56 kg)

Incidentally, organosilane compounds (a)–(e) in Tables 2–4 are as follows:

(a) γ-glycidoxypropyltrimethoxysilane (KBM 403 made by Shin-Etsu Chemical Co., Ltd.)

(b) γ-glycidoxypropylmethyldiethoxysilane (KBE 402 made by Shin-Etsu Chemical Co., Ltd.)

(c) β-(3,4-epoxycyclohexyl)ethyltrimethoxysilane (KBM 303 made by Shin-Etsu Chemical Co., Ltd.)

(d) γ-mercaptopropyltrimethoxysilane (KBM 803 made by Shin-Etsu Chemical Co., Ltd.)

(e) γ-aminopropyltriethoxysilane (KBE 903 made by Shin-Etsu Chemical Co., Ltd)

As to reinforcing fillers in Tables 2–4, GF and CF are glass fiber and carbon fiber, respectively.

REFERENTIAL EXAMPLE 1

Production of polyorganosiloxane rubber S-1

2-parts by weight of tetraethoxysilane and 98 parts by weight of octamethylcyclotetrasiloxane were mixed to obtain 100 parts by weight of a mixed siloxane. 1 part by weight of sodium dodecylbenzenesulfonate and 1 part by weight of dodecylbenzenesulfonic acid were dissolved in 200 parts by weight of distilled water. To the aqueous solution was added 100 parts by weight of the above mixed siloxane. The obtained mixture was preliminarily stirred at 10,000 rpm in a homomixer. The mixture was allowed to pass through a homogenizer three times at a pressure of 200 kg/cm² to emulsify the mixed siloxane. Thereby, an organosiloxane latex was obtained. The latex was transferred to a separable flask equipped with a condenser and a stirrer. The latex was heated at 80° C. for 6 hours with stirring and then cooled to 10° C. and held in this condition for 20 hours. The latex was neutralized at pH 6.9 with an aqueous sodium hydroxide to complete the reaction. A yield of polymerization of the polyorganosiloxane rubber was 91.2% and a degree of swelling thereof was 23. An average particle size thereof was 0.24 μm.

REFERENTIAL EXAMPLE 2

Production of polyorganosiloxane rubber S-2–S-11

Various polyorganosiloxane rubbers S-2–S-11 were prepared in the same manner as in Referential Example 1, except the conditions shown in Table 1.

The properties thereof are shown in Table 1 collectively.

EXAMPLE 1

100 parts by weight of powder of a polyphenylene sulfide resin (T-4 made by Tohpren Co., Ltd.; average particle size 50 μm) moistened with 5 parts by weight of acetone were added to 500 parts by weight of the latex of the polyorganosiloxane rubber (S-1) obtained in Referential Example 1, with stirring. Thereby a dispersion liquid was prepared. The dispersion liquid was added dropwise to 600 parts by weight of a 1% by weight aqueous calcium chloride to aggregate the dispersed substance. The obtained aggregated substance was isolated, washed and thereafter dried at 80° C. for 10 hours to remove water. Thereby, the polyphenylene sulfide resin was obtained in which the polyorganosiloxane rubber (S-1) was dispersed.

33 parts by weight of the polyphenylene sulfide resin in which S-1 was dispersed was mixed with 67 parts by weight of the powder of the polyphenylene sulfide resin (T-4) to obtain 100 parts by weight of the mixture in which S-1 was contained in an amount of 20 parts by weight. 100 parts by weight of the mixture was mixed with 1 part by weight of γ-glycidoxypropyltrimethoxysilane; (KBM 403 made by Shin-Etsu Chemical Co., Ltd.) in a Henschel mixer. The obtained composition was extruded at a barrel temperature of 310° C. with a twin-screw extruder of 30 mmφ (made by Werner & Pfleiderer Co.) and pelletized. The obtained pellets were molded at a cylinder temperature of 310° C. and at a mold temperature of 140° C. with an injection extruder (IS-100 made by Toshiba Machine Co., Ltd.) to make a sample piece. Various properties of the sample piece are shown in Table 2.

EXAMPLES 2-13

The polyphenylene sulfide resin in which the polyorganosiloxane rubber S-1 obtained in Referential Example 1 was dispersed was prepared and mixed with various organosilane compounds and, if necessary, reinforcing agents in the same manner as in Example 1 except for the conditions shown in Table 2. The compositions were extruded and subjected to injection molding to obtain various sample pieces in the same manner as in Example 1. Various properties of these sample Pieces are shown in Table 2.

COMPARATIVE EXAMPLES 1-9

The polyorganosiloxane rubber S-1, a polyphenylene sulfide resin T-4, organosilane compounds and reinforcing fillers were mixed in the same manner as in Example 1 except for the conditions shown in Table 3. The obtained compositions were extruded and subjected to injection molding to obtain various sample pieces in the same manner as in Example 1. Various properties of these sample pieces are shown in Table 3.

COMPARATIVE EXAMPLE 10

A composition was prepared in the same manner as in Example 1, except that γ-glycidoxypropyltrimethoxysilane was used in an amount of 20 parts by weight. The composition had too high a viscosity to be extruded.

COMPARATIVE EXAMPLE 11

A composition was prepared, extruded and subjected to injection molding to obtain a sample piece in the same manner as in Example 1, except that γ-glycidoxypropyltrimethoxysilane was replaced by γ-mercaptopropyltrimethoxysilane (KBM 803 made by Shin-Etsu Chemical Co., Ltd.). Various properties of the sample piece are shown in Table 3.

COMPARATIVE EXAMPLE 12

A composition was prepared, extruded and subjected to injection molding to obtain a sample piece in the same manner as in Example 1, except that γ-glycidoxypropyltrimethoxysilane was replaced by γ-aminopropyltriethoxysilane (KBE 903 made by Shin-Etsu Chemical Co., Ltd.). Various properties of the sample piece are shown in Table 3.

EXAMPLES 14–23

Compositions were prepared, extruded and subjected to injection molding to obtain various sample pieces in the same manner as in Example 1, except that the polyorganosiloxane rubber S-1 was replaced by S-2 - S-11 and components were mixed according to the formulas shown in Table 4. Various properties of these sample pieces are shown in Table 4.

EXAMPLE 24

A composition was prepared, extruded and subjected to injection molding to obtain a sample piece in the same manner as in Example 1, except that the polyorganosiloxane rubber S-1 was replaced by powder of a silicone resin having an average particle size of 1 μm–2 μm (X-52-590A made by Shin-Etsu Chemical Co., Ltd.; degree of swelling 3) (S-12) and components were mixed according to the formulas shown in Table 4. Various properties of the sample piece are shown in Table 4.

TABLE 1

|  | S-2 | S-3 | S-4 | S-5 | S-6 | S-7 | S-8 | S-9 | S-10 | S-11 |
|---|---|---|---|---|---|---|---|---|---|---|
| Tetraethoxysilane (parts by weight) | 2 | 2 | 2 | 2 | 1 | 5 | 0.7 | 35 | 0.1 | 2 |
| Octamethylcyclotetrasiloxane (parts by weight) | 98 | 98 | 98 | 98 | 99 | 95 | 99.3 | 65 | 99.9 | 98 |
| Pressure in a homogenizer (kg/cm$^2$) | 200 | 200 | 100 | 350 | 200 | 200 | 200 | 200 | 200 | 350 |
| Number of times of passing through a homogenizer | 1 | 5 | 1 | 5 | 3 | 3 | 3 | 3 | 3 | 10 |
| Yield of polymerization of polyorganosiloxane rubber (%) | 91 | 91 | 91 | 91 | 91 | 91 | 91 | 91 | 91 | 91 |
| Degree of swelling of polyorganosiloxane rubber | 22 | 23 | 23 | 23 | 34 | 6 | 42 | 1 | 60 | 23 |
| Average particle size of polyorganosiloxane rubber (μm) | 0.28 | 0.20 | 0.33 | 0.13 | 0.24 | 0.23 | 0.25 | 0.23 | 0.26 | 0.05 |

TABLE 2

|  | Example | | | | | | | | | | | | |
|---|---|---|---|---|---|---|---|---|---|---|---|---|---|
|  | 1 | 2 | 3 | 4 | 5 | 6 | 7 | 8 | 9 | 10 | 11 | 12 | 13 |
| Polyorganosiloxane rubber (S-1) (parts by weight) | 20 | 20 | 20 | 20 | 20 | 20 | 10 | 5 | 2.5 | 30 | 20 | 20 | 20 |
| Polyphenylene sulfide resin (parts by weight) | 80 | 80 | 80 | 80 | 80 | 80 | 90 | 95 | 97.5 | 70 | 80 | 80 | 80 |
| Type and amount of organosiloxane compound (parts by weight) | (a) 1 | (a) 1 | (a) 1 | (a) 1 | (a) 5 | (a) 0.5 | (a) 1 | (a) 1 | (a) 1 | (a) 1 | (b) 1 | (c) 1 | (a) 1 |
| Type and amount of reinforcing filler (parts by weight) | — | GF 67 | GF 43 | GF 150 | GF 67 | GF 67 | GF 67 | GF 67 | GF 67 | GF 67 | GF 67 | GF 67 | CF 43 |
| Izod impact strength with ⅛" notch at 23° C. (kg · cm/cm) | 35 | 21 | 23 | 16 | 22 | 20 | 15 | 13 | 12 | 25 | 20 | 20 | 10 |
| Heat distortion temperature (°C.) | 108 | 252 | 251 | 254 | 250 | 252 | 256 | 259 | 261 | 235 | 251 | 250 | 250 |

TABLE 3

|  | Comparative Example | | | | | | | | | | | |
|---|---|---|---|---|---|---|---|---|---|---|---|---|
|  | 1 | 2 | 3 | 4 | 5 | 6 | 7 | 8 | 9 | 10 | 11 | 12 |
| Polyorganosiloxane rubber (S-1) (parts by weight) | — | — | — | — | 20 | 20 | — | — | — | 20 | 20 | 20 |
| Polyphenylene sulfide resin (parts by weight) | 100 | 100 | 100 | 100 | 80 | 80 | 100 | 100 | 100 | 80 | 80 | 80 |
| Type and amount of organosiloxane compound (parts by weight) | — | — | — | — | — | — | (a) 1 | — | (a) 1 | (a) 20 | (d) 1 | (e) 1 |
| Type and amount of reinforcing filler (parts by weight) | — | GF 67 | GF 43 | GF 150 | — | GF 67 | GF 67 | CF 43 | — | — | GF 67 | GF 67 |

TABLE 3-continued

| | Comparative Example | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| Izod impact strength with ⅛" notch at 23° C. (kg · cm/cm) | 2 | 8 | 7 | 6 | 6 | 9 | 8 | 3 | 2 | — | 6 | 5 |
| Heat distortion temperature (°C.) | 115 | 265 | 265 | 266 | 103 | 250 | 263 | 260 | 113 | — | 250 | 250 |

TABLE 4

| | Example | | | | | | | | | | |
|---|---|---|---|---|---|---|---|---|---|---|---|
| | 14 | 15 | 16 | 17 | 18 | 19 | 20 | 21 | 22 | 23 | 24 |
| Type and amount of Polyorganosiloxane rubber (parts by weight) | (S-2) 20 | (S-3) 20 | (S-4) 20 | (S-5) 20 | (S-6) 20 | (S-7) 20 | (S-8) 20 | (S-9) 20 | (S-10) 20 | (S-11) 20 | (S-12) 20 |
| Polyphenylene sulfide resin (parts by weight) | 80 | 80 | 80 | 80 | 80 | 80 | 80 | 80 | 80 | 80 | 80 |
| Type and amount of organosiloxane compound (parts by weight) | (a) 1 | (a) 1 | (a) 1 | (a) 1 | (a) 1 | (a) 1 | (a) 1 | (a) 1 | (a) 1 | (a) 1 | (a) 1 |
| Type and amount of reinforcing filler (parts by weight) | GF 67 | GF 67 | GF 67 | GF 67 | GF 67 | GF 67 | GF 67 | GF 67 | GF 67 | GF 67 | GF 67 |
| Izod impact strength with ⅛" notch at 23° C. (kg · cm/cm) | 22 | 20 | 22 | 17 | 20 | 15 | 16 | 11 | 12 | 11 | 11 |
| Heat distortion temperature (°C.) | 252 | 251 | 252 | 252 | 251 | 252 | 251 | 251 | 251 | 251 | 250 |

EXAMPLE 25

A composition was prepared and subjected to extrusion molding in the same manner as in Example 1, except that 5,6-epoxyhexyltrimethoxysilane was used as an organosilane compound. The properties of the article of the composition were measured. Izod impact strength was 34 kg.cm/cm and heat distortion temperature was 108° C.

EXAMPLE 26

A composition was prepared and subjected to extrusion molding in the same manner as in Example 1, except that γ-(3,4-epoxycyclohexylmethoxy)propyltrimethoxysilane was used as an organosilane compound. The properties of the article of the composition were measured. Izod impact strength was 35 kg.cm/cm and heat distortion temperature was 108° C.

What is claimed is:

1. A polyarylene sulfide resin composition comprising a composition obtained by mixing 60-99 parts by weight of a polyarylenesulfide resin (A), 40-1 parts by weight of a polyorganosiloxane rubber (B) being in the form of powder with an average particle size of 0.1-0.5 μm and having a degree of swelling of 3-50 measured using toluene as a solvent, 0.01-10 parts by weight of an organosilane compound (C) represented by the following formula:

$$Y-R-\underset{\underset{R^2_{(3-n)}}{|}}{Si}-Z_n,$$

wherein n is an integer of 1-3, R is a direct bond, an alkylene group having 2-6 carbon atoms or a dialkylene ether group having 4-7 carbon atoms represented by the formula:

$$-R^3-O-R^4-,$$

wherein each of $R^3$ and $R^4$ is independently an alkylene group, a total number of carbon atoms in both $R^3$ and $R^4$ being 4-7, $R^2$ is a methyl group or ethyl group, Y is:

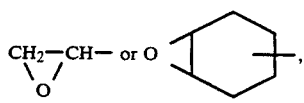

Z is a methoxy group or ethoxy group,
and 0-300% by weight of a reinforcing filler (D) based on the total weight of the component (A), (B) and (C) wherein the total amount of the components (A) and (B) is 100 parts by weight.

2. A polyarylene sulfide resin composition according to claim 1, wherein the polyarylene sulfide resin (A) is a polyphenylene sulfide resin.

3. A polyarylene sulfide resin composition according to claim 1, wherein the organosilane compound (C) is at least one selected from the group consisting of γ-glycidoxypropyltrimethoxysilane, γ-glycidoxypropyltriethoxysilane,
γglycidoxypropylmethyldimethoxysilane,
γ-glycidoxypropylethyldimethoxysilane,
γ-glycidoxypropylmethyldiethoxysilane,
γ-glycidoxypropylethyldiethoxysilane,
γ-glycidoxypropyldimethylethoxysilane, β-(3,4-epoxycyclohexyl)ethyltrimethoxysilane,
γ-(3,4-epoxycyclohexylmethoxy)propyltrimethoxysilane,
3,4-epoxybutyltrimethoxysilane,
5,6-epoxyhexyltrimethoxysilane,
5,6-epoxyhexylmethyldimethoxysilane,
5,6-epoxyhexylethyldiethoxysilane, and
7,8-epoxyoctyltrimethoxysilane.

4. A polyarylene sulfide resin composition according to claim 1, wherein the polyorganosiloxane rubber (B) comprises polydimethylsiloxane.

5. A polyarylene sulfide resin composition comprising a composition obtained by mixing
60–99 parts by weight of a polyarylenesulfide resin (A),
40–1 parts by weight of a polyorganosiloxane rubber (B) being in the form of powder with an average particle size of 0.1–0.5 μm and having a degree of swelling of 3–50 measured using toluene as a solvent,
0.01–10 parts by weight of an organosilane compound having at least one epoxy group and at least one alkoxy group bonded directly to a silicon atom (C) and 0–300% by weight of a reinforcing filler (D) based on the total weight of the component (A), (B) and (C) wherein the total amount of the components (A) and (B) is 100 parts by weight.

6. A polyarylene sulfide resin composition according to claim 5, wherein the organosilane compound (C) is 9,10-epoxydecyltrimethoxysilane.

* * * * *